(12) United States Patent
Zhang et al.

(10) Patent No.: US 6,726,954 B2
(45) Date of Patent: Apr. 27, 2004

(54) METHOD AND SYSTEM FOR FORMING COPPER THIN FILM

(75) Inventors: Minjuan Zhang, Ann Arbor, MI (US); Akiko Kobayashi, Tokyo (JP); Toshiaki Sasaki, Tokyo (JP); Susumu Akiyama, Tokyo (JP); Atsushi Sekiguchi, Tokyo (JP)

(73) Assignee: ANELVA Corporation, Tokyo (JP)

( * ) Notice: Subject to any disclaimer, the term of this patent is extended or adjusted under 35 U.S.C. 154(b) by 158 days.

(21) Appl. No.: 09/874,066

(22) Filed: Jun. 6, 2001

(65) Prior Publication Data

US 2002/0052109 A1 May 2, 2002

(30) Foreign Application Priority Data

Jun. 7, 2000 (JP) .......................................... 2000-171204
Feb. 2, 2001 (JP) ........................................ 2001-027292

(51) Int. Cl.$^7$ ............................................. C23C 16/18
(52) U.S. Cl. ................. 427/252; 427/255.29; 438/681; 438/687
(58) Field of Search ................................ 427/125, 252, 427/255.29; 438/681, 687

(56) References Cited

U.S. PATENT DOCUMENTS 5,953,634 A * 9/1999 Kajita et al. ............... 438/687
6,319,728 B1 * 11/2001 Bhan et al. .................. 438/687

FOREIGN PATENT DOCUMENTS

| EP | 1191124 | * | 3/2002 |
| JP | 08-139030 | * | 5/1996 |

* cited by examiner

Primary Examiner—Timothy Meeks
(74) Attorney, Agent, or Firm—Wenderoth, Lind & Ponack L.L.P.

(57) ABSTRACT

In a method and a system for forming a copper thin film in which a raw material gas is introduced into a substrate processing chamber storing a substrate and being under a reduced pressure to form a copper thin film on the substrate, an addition gas is introduced into the substrate processing chamber in addition to the raw material gas at the initial stage of deposition. Thereafter, the introduction of the addition gas is stopped, while the introduction of the raw material gas is continued. Alternatively, an addition gas is introduced into the substrate processing chamber before the start of the deposition process, and the addition gas is introduced into the substrate processing chamber in addition to the raw material gas at the initial stage of deposition. Thereafter, the introduction of the addition gas is stopped, while the introduction of the raw material gas is continued.

19 Claims, 8 Drawing Sheets

ADDITION OF WATER FOR 30 SECONDS
OR LESS DURING DEPOSITION

ADDITION OF WATER FOR 30 SECONDS
OR MORE DURING DEPOSITION

METHOD AND SYSTEM FOR FORMING COPPER THIN FILM

BACKGROUND OF THE INVENTION

1. Field of the Invention

The present invention relates to a method of forming a copper thin film on a substrate by using an organometallic complex as a raw material and a system therefor.

2. Description of the Related Art

A chemical vapor deposition method and a chemical vapor deposition system using an organometallic complex as a raw material has been known as a chemical vapor deposition system for forming a film of a wiring material on a substrate. Copper is thought to be a promising material for forming a wiring material after aluminum, and a thin copper film has been formed by using a chemical vapor deposition method and a system for the chemical vapor deposition method, in which copper hexafluoroacetylacetone (trimethylvinylsilyl) (I) hereinafter expressed by Cu(hfac)(tmvs) in the present specification) is used as a raw material.

In this conventional copper thin film forming method, in order to improve the deposition rate, the adhesion performance and the stability of copper with respect to the surface of a substrate, a method of adding water, water vapor, hexafluoroacetone dihydrate ($Hhfac.2H_2O$) or the like to Cu(hfac)(tmvs), which is a raw material, has been proposed (for example, Chemical vapor deposition of Copper from Cu+1 precursors in the presence of water vapor, Appl. Phys. Lett. 63(20), pp. 2842–2844, and Japanese unexamined patent-publication No. JP-A-10-140352).

In the copper thin film forming method conventionally proposed, in which water vapor or the like is added to a raw material gas, the water vapor is added during the formation of a thin film. However, this method presents drawbacks of producing micro-voids and increasing the concentration of impurities (fluorine: F, oxygen: O, carbon: C) in the formed copper thin film.

For this reason, there has been room for developing a method and system for forming a copper thin film having an excellent adhesion performance and the same level of specific resistance as bulk, and which is capable of undergoing mass production as a method for forming the wiring of a semiconductor system.

SUMMARY OF THE INVENTION

It is the object of the present invention to provide a method and a system for forming a copper thin film by chemical vapor deposition in which the adhesion performance of a copper thin film to a substrate is improved, and in which a copper thin film having a low concentration of impurities and an excellent specific resistance is formed.

In order to accomplish the object described above, the copper thin film forming method proposed by the present invention is a method of forming a copper thin film, in which a raw material gas is introduced into a substrate processing chamber storing a substrate and which is under a reduced pressure so as to form a copper thin film on the substrate. In particular, the method includes introducing an addition gas in addition to the raw material gas at the initial stage of deposition. Thereafter, the introduction of the addition gas is stopped, while the introduction of raw material gas is continued.

The above-described copper thin film forming method is adopted in a seed process for forming a thin film of, for example, from about 20 nm to 100 nm in thickness on a diffused barrier film or an adhesion layer film made of TiN, Ta, TaN, TiSiN, TaSiN, and the like.

In the case of a buying process for forming a thin film of about 500 nm to 2000 nm, it is possible to adopt another copper thin film forming method of the present invention. In particular, at the initial stage of deposition, an addition gas is introduced in addition to the introduction of the raw material gas. Thereafter, the introduction of the addition gas is stopped, whereas the introduction of the raw material gas is continued, and the introduction of the addition gas is conducted at predetermined intervals of time, whereby the copper thin film is formed.

In the above-described copper thin film forming methods of the present invention, the introduction of the addition gas conducted at the initial stage of deposition in addition to the introduction of the raw material gas is intended to produce an excellent adhesion performance. The introduction of the addition gas is required to be conducted at least for the minimum time of about 0.5 seconds so as to accomplish this object.

On the other hand, a long introduction time for the addition gas increases the number of micro-voids generated, which is not preferable, and the continuous introduction of the addition gas during the deposition process increases the concentration of impurities and the number of micro-voids generated, which is also undesirable. Therefore, it is desirable that the introduction time for the addition gas is about 30 seconds at the longest, depending on the length of time of deposition.

In the above description, in the case of the burying process for forming a thin film of about 500 nm to 2000 nm, at the initial stage of deposition, an addition gas is introduced in addition to the introduction of the raw material gas. Thereafter, only the introduction of the raw material gas is continued to so as form a film, and the introduction of the addition gas is repeatedly conducted at predetermined intervals of time. This process is conducted in order to reduce the concentration of impurities in the copper thin film and continue forming the dense film, to prevent a decrease in deposition rate, and further to prevent the surface of the copper thin film from becoming rough.

Therefore, it is desirable that after the introduction of the addition gas is completed at the initial stage of deposition, the introduction of the addition gas is conducted at intervals of time in accordance with the time when the deposition rate decreases or the time when the surface of the copper thin film being formed becomes rough. As described above, since the introduction of the addition gas at this time is intended to recover the decreased deposition rate or to prevent the surface of the copper thin film being formed from becoming rough, at least about 0.5 seconds is good enough for the length of time for the introduction of the addition gas.

In any of the copper thin film forming methods described above in accordance with the present invention, the following steps can be performed. First, the introduction of the addition gas into the substrate processing chamber is conducted. Thereafter, while continuing the introduction of the addition gas, the introduction of the raw material gas into the substrate processing chamber is started to start depositing, and the introduction of the addition gas is continued during the initial stage of the deposition process.

It is known that the separation of the copper thin film, which indicates a decrease in adhesion performance, develops at the interface between the copper thin film and a diffused barrier film. Therefore, an effective method for improving the quality of the interface (in particular, an adhesion performance) is to introduce the addition gas into the substrate processing chamber before the introduction of the raw material gas into the substrate processing chamber is started so as to start depositing. Thus, the surface of the substrate on which the diffused barrier film is formed as an underlying film is exposed to the atmosphere of the addition gas.

In the above description, the addition gas may be any one of a water gas (that is, steam made by evaporating water) a gas made by evaporating an alcohol derivative such as methyl alcohol, ethyl alcohol, and isopropyl alcohol; a gas made by evaporating a carboxylic acid derivative such as acetic acid and pyromellic acid; and a gas made by evaporating a β-diketone derivative such as acethylacetone, hexafluoroacetylacetone, and dihydroxymethane. It is possible to form a copper thin film having good adhesion performance and an excellent film quality by the above-described methods in accordance with the present invention using any one of them.

In this respect, if the water, the alcohol derivative, the carboxylic acid derivative, and the β-diketone derivative are subjected to a process for removing dissolved oxygen therein and are evaporated, and then the gas is added, it is possible to form a copper thin film having a further excellent film quality.

Further, the introduction of the addition gas into the substrate processing chamber may be conducted by introducing a water gas (that is, steam made by evaporating water filled into a gas cylinder, which is connected to the substrate processing chamber) into the substrate processing chamber from the gas cylinder.

The gas cylinder can be connected to the substrate processing chamber by and through any 1 of the following mechanisms. For example, the gas cylinder may be connected to the substrate processing chamber with a flow control mechanism therebetween. Alternatively, the gas cylinder may be connected to a carrier gas introducing pipe with a flow control mechanism therebetween. Furthermore, the carrier gas introducing pipe may be connected to a vaporizer in a raw material gas introducing mechanism for supplying a raw material gas to the substrate processing chamber. The steam made by evaporating water can be introduced into the substrate processing chamber from the gas cylinder by any 1 of the above-described mechanisms.

If an addition gas which is a water gas (that is, steam made by evaporating water) is introduced into a substrate processing chamber from a gas cylinder filled with the steam, the concentration of water with respect to a carrier gas (for example, argon gas) can be correctly adjusted in advance. Accordingly, it is possible to supply the steam to the substrate processing chamber stably and correctly. Since water is liquid at a normal temperature and a normal pressure, the pressure of water can not be increased to a pressure more than a saturated vapor pressure when the water is filled into a gas cylinder. Therefore, the above-mentioned carrier gas (for example, argon gas) is necessary, and the use of the carrier gas makes it possible to fill steam into the gas cylinder under a high pressure of, for example, 150 kg/cm$^2$ to the extent of about 300 ppm by volume.

Next, a system for forming a copper thin film proposed by the present invention so as to accomplish the object described above comprises: a substrate processing chamber the inside of which can be held under a reduced pressure; a substrate supporting mechanism for supporting a substrate in tie substrate processing chamber, a substrate temperature control mechanism for keeping the substrate at a predetermined temperature; and a raw material gas introducing mechanism for evaporating a liquid raw material or a solid raw material into a raw material gas and for supplying the raw material gas to the substrate processing chamber in. An addition gas introducing mechanism includes a mechanism for removing dissolved oxygen in a liquid addition material and a mechanism for evaporating the liquid addition material, from which dissolved oxygen is removed, and is connected to the substrate processing chamber via a flow control mechanism.

As described above, in the system for forming a copper thin film as proposed by the present invention, the flow control mechanism is disposed between the substrate processing chamber and the addition gas introducing mechanism. Therefore, the addition gas can be introduced into the substrate processing chamber only at initial stage of the deposition process or at an initial stage of the deposition process and at predetermined intervals of time during the following deposition, further before the start of the deposition process.

Further, as described above, the addition gas introducing mechanism includes the mechanism for removing dissolved oxygen in the liquid addition material and the mechanism for evaporating the liquid addition material from which the dissolved oxygen is removed. Therefore, the addition material from which the dissolved oxygen is previously removed is evaporated and introduced into the substrate processing chamber, whereby the quality of copper thin film formed on the substrate can be improved.

In this regard, in place of the addition gas introducing mechanism including the mechanism for removing dissolved oxygen in the liquid addition material and the mechanism for evaporating the liquid addition material from which the dissolved oxygen is removed, a gas cylinder may be adopted which is filled with steam made by evaporating water.

In this case, the gas cylinder can be connected to the substrate processing chamber by and through any 1 of the following mechanisms. For example, the gas cylinder can be connected to the substrate processing chamber with a flow control mechanism therebetween. Alternatively, the gas cylinder can be connected to a carrier gas introducing pipe with a flow control mechanism therebetween. The carrier gas introducing pipe can also be connected to a vaporizer in a raw material gas introducing mechanism for supplying a raw material gas to the substrate processing chamber.

If the gas cylinder filled with steam made by evaporating water is adopted, as described above, it is possible to simplify the configuration of the addition gas introducing mechanism and to supply a necessary concentration of steam to the substrate processing chamber stably and correctly using a simple operation.

According to the present invention, in a method and a system for forming a copper thin film by the chemical vapor deposition (CVD) method using an organometallic complex, it is possible to improve the adhesion performance of a copper thin film to a substrate and to form a copper thin film of high purity and excellent quality, which has a small amount of impurities (such as F, O, C) in the formed copper thin film, few micro-voids, and which has the same level of specific resistance (1.7 $\mu\Omega$cm) as bulk.

DETAILED DESCRIPTION OF THE INVENTION

The preferred embodiments of the present invention will be described with reference to the accompanying drawings.

Figure 1:
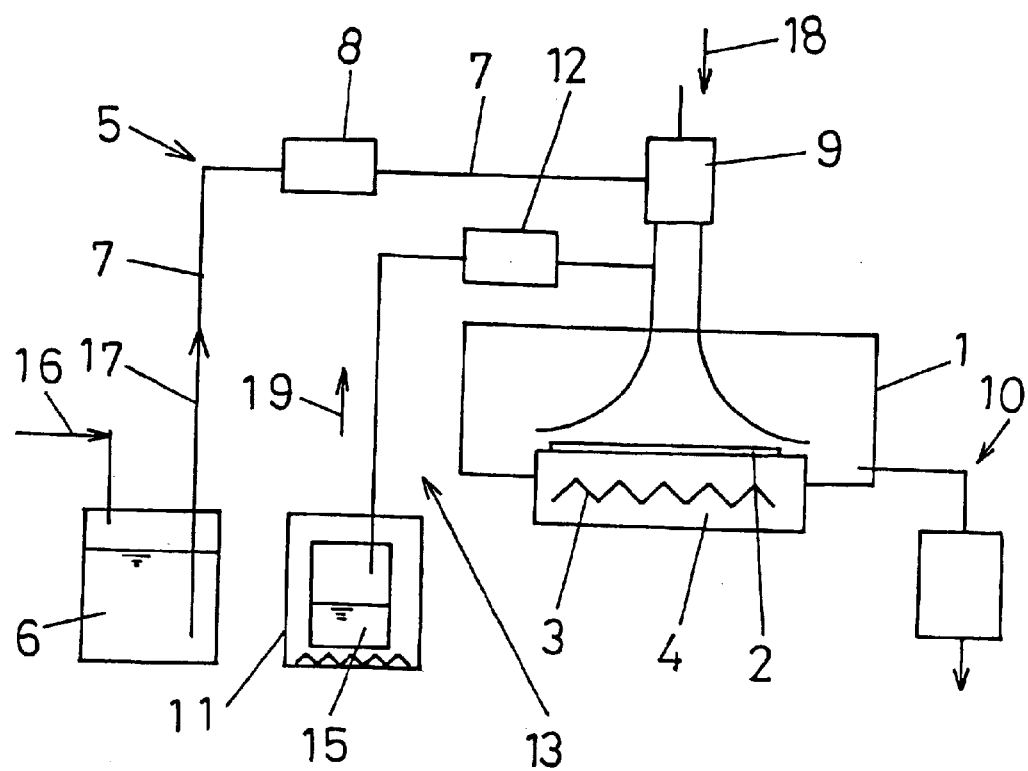
FIG. 1 is a schematic diagram of a copper thin film forming system which can be used for a copper thin film forming method in accordance with the present invention.

FIG. 1 is a schematic view of a copper thin film forming system which can be used for a copper thin film forming method in accordance wish the present invention.

In a substrate processing chamber 1 capable of keeping the inside of the chamber 1 in a reduced pressure state by a pressure reducing unit not shown in the drawing, there is disposed a substrate supporting mechanism 4, having a substrate temperature control mechanism, for supporting a substrate 2. The substrate temperature control mechanism includes a heating mechanism 3, or the heating mechanism 3 and a temperature reducing mechanism (not shown) if necessary (for example, a temperature reducing mechanism for reducing the temperature by flowing air at normal temperature in a cooling trench formed in the substrate supporting mechanism 4), and keeps the substrate 2 to be subjected to a a thin film-forming process at a predetermined temperature.

A raw material gas introducing mechanism 5 for supplying a raw material gas is connected to the substrate processing chamber 1, and the raw material gas introducing mechanism 5 includes a pipe 7 for carrying a liquid raw material 6, flow control device 8 disposed in the pipe 7, and a vaporizer 9. In FIG. 1, a reference numeral 10 denotes an exhaust gas discharging mechanism.

A basic configuration of a chemical vapor deposition system as described therebefore and as shown in FIG. 1 has been publicly known, so further description thereof will be omitted.

In the copper thin film forming system used for the copper thin film forming method in accordance with the present invention, as shown in FIG. 1, the substrate processing chamber 1 is provided with an addition gas introducing mechanism 13 for directly introducing an addition gas into the substrate processing chamber. The addition gas introducing mechanism 13 includes an evaporating unit 11 for vaporizing an addition material (water 15), and a flow control device 12 for starting or stopping the introduction of addition gas into the substrate processing chamber 1, or for controlling the amount of the addition gas introduced.

Figure 2:
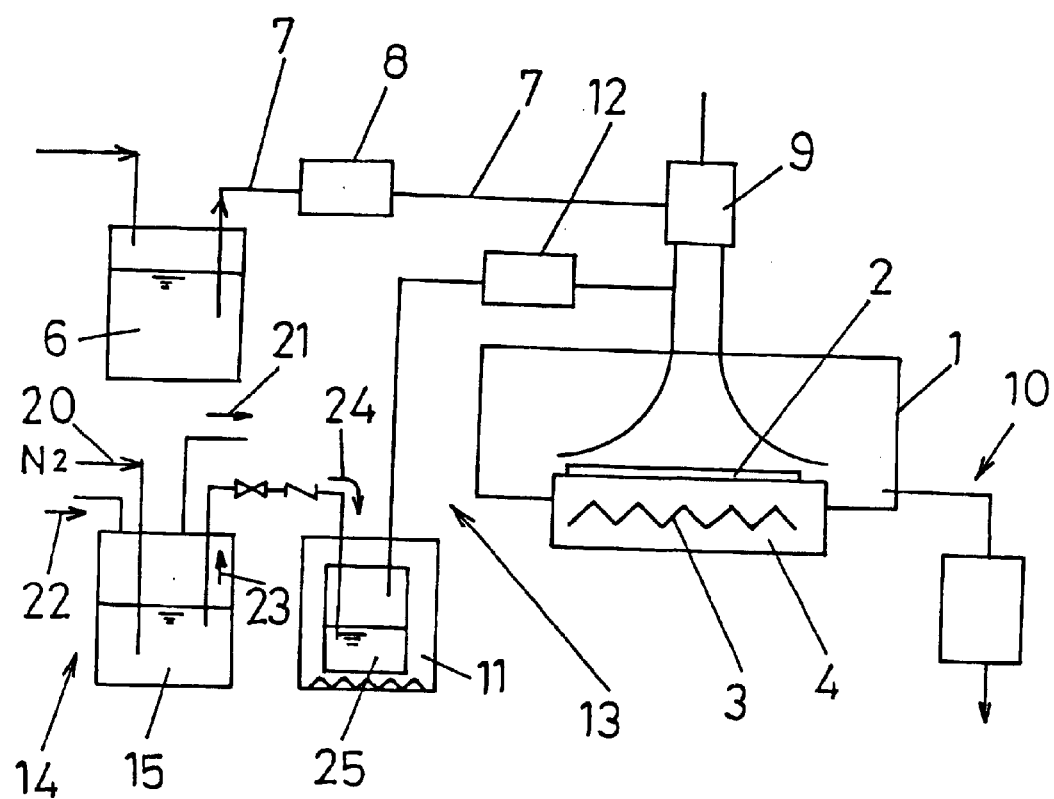
FIG. 2 is a schematic diagram of the copper thin film forming system in accordance with the present invention.

FIG. 2 shows a schematic configuration of the copper thin film forming system in accordance with the preset invention. The same parts as the parts of the copper thin film forming system shown in FIG. 1 have the same reference numerals, and the description thereof will be omitted.

The copper thin film forming system in accordance with the present invention shown in FIG. 2 is characterized in that the addition gas introducing mechanism 13 is provided with an oxygen removing mechanism 14 for removing dissolved oxygen in a liquid addition material.

The copper thin film forming method in accordance with the present invention will hereinafter be described with reference to FIG. 1, FIG. 3, and FIG. 4.

A helium gas or the like is supplied, as shown by an arrow 16 (FIG. 1), for supplying Cu(hfac)(tmvs), which is a raw material, to the vaporizer 9 via the pipe 7, the flow control device 8, and the pipe 7, as shown by an arrow 17 (FIG. 1). The raw material is evaporated at the vaporizer 9, and a carrier gas (Ar) is supplied, as shown by an arrow 18, to start introducing the raw material gas into the substrate processing chamber 1.

On the other hand, water 15 is evaporated by an evaporating unit 11 and is supplied to the flow control device 12, as shown by an arrow 19. At the same time when the raw material gas is introduced (supplied) into the substrate processing chamber 1, a water gas (that is, steam made by evaporating water in the evaporating unit 11) is introduced (supplied) into the substrate processing chamber 1. After a lapse of a predetermined length of time, the introduction of the steam (addition gas) is stopped by controlling the flow control device 12. Thereafter, only the introduction of raw material gas into the substrate processing chamber 1 is continued.

Figure 3:
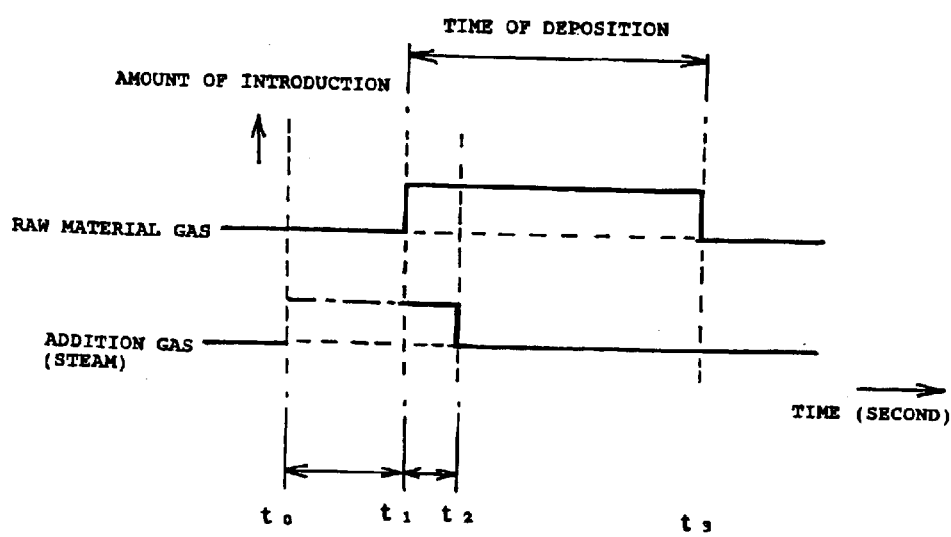
FIG. 3 is a time chart to illustrate the introduction time for a raw material gas and that of for an addition gas in the copper thin film forming method in accordance with the present invention.

FIG. 3 is a time chart to illustrate the timing of the introduction of the raw material gas and an addition gas (steam) in the above-mentioned copper thin film forming method in accordance with the present invention. The time from the time $t_1$, when the introduction of the raw material gas is started, to the time $t_3$, when the introduction of the raw material gas is stopped, is a time of deposition (for example, 10 seconds). The raw material gas is introduced into the substrate processing chamber 1 during the time of deposition.

The addition gas (steam) is introduced (supplied) into the substrate processing chamber 1 only from the time $t_1$ to time $t_2$. In other words, the addition gas is only supplied into chamber 1 for the initial stage of the deposition (for example, 0.5 seconds).

This copper thin film forming method as illustrated in FIG. 3 can be adopted in a process for forming wirings of a semiconductor system. For example, the method can be used in a seed process of forming a thin film having a thickness of from about 20 nm to 100 nm for a comparatively short time of deposition of about 10 to 20 seconds. That is to say, the copper thin film forming method as illustrated in FIG. 3 can be used in a process of forming an electrode in which a burying process to be described below is conducted by an electrolytic copper plating.

Figure 4A:
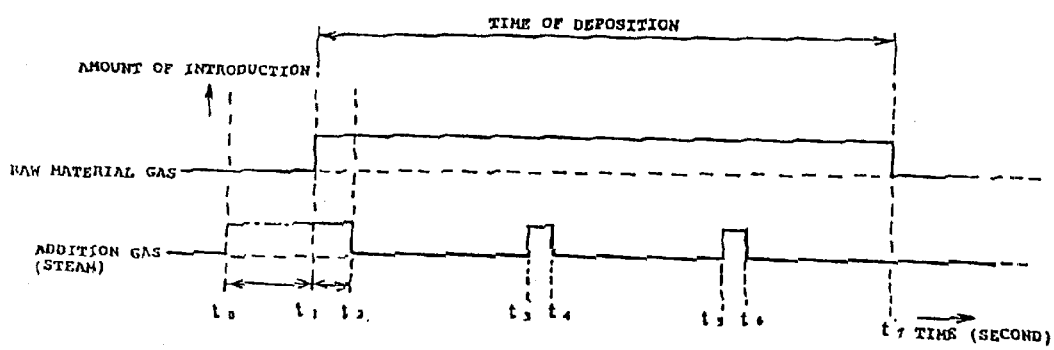
FIG. 4(a) is a time chart to illustrate the introduction time for a raw material gas and that of for an addition gas in another copper thin film forming method in accordance with the present invention.

Further, in the case of the burying process in which a thin film having a thickness of about from 500 nm to 2000 nm is formed for a time of deposition of about 80 seconds or more, it is preferable that the introduction of raw material gas and the introduction of addition gas (steam) are conducted respectively at the timings shown in FIG. 4(a). That is, the introduction of the raw material gas and the addition gas (steam) into the substrate processing chamber 1 is started at the time $t_1$ and the introduction of the addition gas (steam) is stopped at the time $t_2$. Thereafter, the introduction of the raw material gas is continued to the time $t_7$, and the introduction of the addition gas (steam) into the substrate processing chamber 1 is conducted from the time $t_3$ to the time $t_4$ and from the time $t_5$ to the time $t_6$.

Figure 4B:
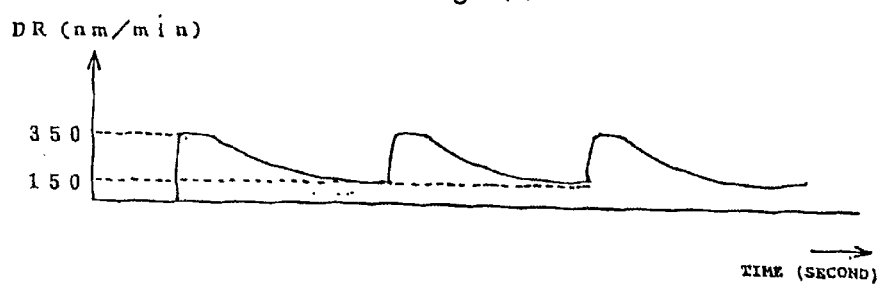
FIG. 4(b) is still another time chart to illustrate the time-series change in a film forming speed in another copper thin film forming method in accordance with the present invention.

The time $t_3$ and the time $t_5$ can be previously determined. For example, as shown in FIG. 4(b), in order to prevent a decrease in the deposition rate, the addition gas (steam) can be introduced at the time when the deposition rate decreases. As can be seen from FIG. 4(b), the deposition rate reaches 350 nm/min at the time when the introduction of the raw material gas is started, and decreases to about 150 nm/min at the time $t_3$ and $t_5$. However, the deposition rate can be recovered by the introduction of the addition gas (steam).

Also in the case where a copper thin film is formed by the method in accordance with the present invention by the use of the copper thin film forming system shown in FIG. 2, the raw material gas and the addition gas are also introduced into the substrate processing chamber 1 according to the time chart shown in FIG. 3 and FIG. 4(a), as described above.

In the case where the copper thin film forming system shown in FIG. 2 is used, the dissolved oxygen is first removed from water 15 by a mechanism 14 for removing dissolved oxygen from a liquid addition material. That is, a nitrogen gas is introduced into the water 15 as shown by an arrow 20, to bubble the water 15 to remove and discharge the dissolved oxygen in the water 15 as shown by an arrow 21. In this way, bubbling of the water 15 is continued for about 2 hours and the water 25 from which the dissolved oxygen is removed is carried into the evaporating unit 11 as shown by arrows 23, 24 by a gas (for example, a nitrogen gas) introduced as shown by an arrow 22.

As a result, if the copper thin film forming system in accordance with the present invention shown in FIG. 2 is used, the addition gas of the water 25 from which the dissolved oxygen is removed, that is (the steam made by evaporating the water subjected to a process of removing dissolved oxygen) can be introduced into the substrate processing chamber 1.

In this way, the use of the water 25 from which dissolved oxygen is removed as an addition gas has an advantage in stabilizing deposition characteristics such as uniformity in film thickness among substrates after a deposition process.

In this respect, in the time charts shown in FIG. 3 and FIG. 4(a), the addition gas (for example, steam made by evaporating water, the steam made by evaporating water from which dissolved oxygen is removed, or the like) can be introduced into the substrate processing chamber 1 from the time $t_0$ to time $t_1$ before the start of deposition, as shown by a single dot and dash line. The object of this process is to introduce moisture into the atmosphere of the substrate processing chamber 1 before the raw material gas is introduced into the substrate processing chamber 1 to start depositing.

This can expose the surface of a substrate having a diffused barrier film made of TiN, Ta, TaN, or the like as an underlying film to the atmosphere of the addition gas (for example, steam made by evaporating water, or steam made by evaporating water from which dissolved oxygen is removed, or the like) to improve an interface. Thereby, an effect of forming a copper thin film having excellent adhesion performance and quality by introducing the addition gas at the initial stage of the following deposition process shown from the time $t_1$ to the time $t_2$ is further improved.

In this respect, the object of the introduction of the addition gas (for example, steam made by evaporating water, or steam made by evaporating water from which dissolved oxygen is removed, or the like) into the substrate processing chamber 1 before the start of the deposition process is to make the atmosphere most, as described above. Therefore, the minimum time of about 0.5 seconds is sufficient. In order to effectively conduct the deposition process and to increase a throughput (the number of pieces of substrates to be processed for a unit time), a long introduction time for the addition gas before the start of the deposition process is not required.

Figure 5:
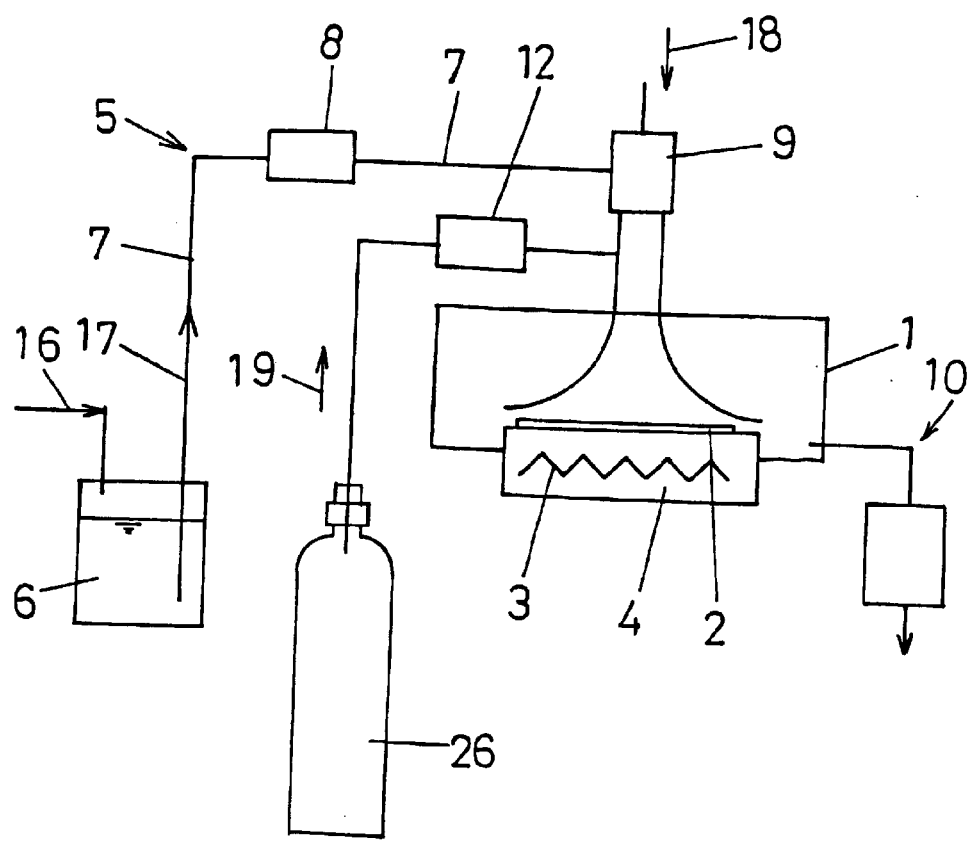
FIG. 5 is a schematic diagram of another copper thin film forming system in accordance with the present invention.

FIG. 5 shows a schematic configuration of another copper thin film forming system in accordance with the present invention. The copper thin film forming system shown in FIG. 5 is provided with a gas cylinder 26 filled with a water gas (that is, steam) in place of the addition gas introducing mechanism 13 in the system shown in FIG. 1, and in place of the mechanism 14 for removing dissolved oxygen in the liquid addition material and the addition gas introducing mechanism 13 in the system shown in FIG. 2.

A gas cylinder filled with steam made by evaporating water, for example, 300 ppm $H_2O$/Ar gas cylinder can be used as the gas cylinder 26.

The copper thin film forming system employing such a gas cylinder 26 can correctly supply a desired amount and concentration of steam to the substrate processing chamber 1 by correctly adjusting the concentration of water with respect to a carrier gas (for example, Ar gas).

Further, since the configuration and operation of the addition gas introducing mechanism 13 and the like in the system shown in FIG. 1 and FIG. 2 are not required, the steam can stably be supplied to the substrate processing chamber 1 by a simple configuration and a simple operation.

Figure 6:
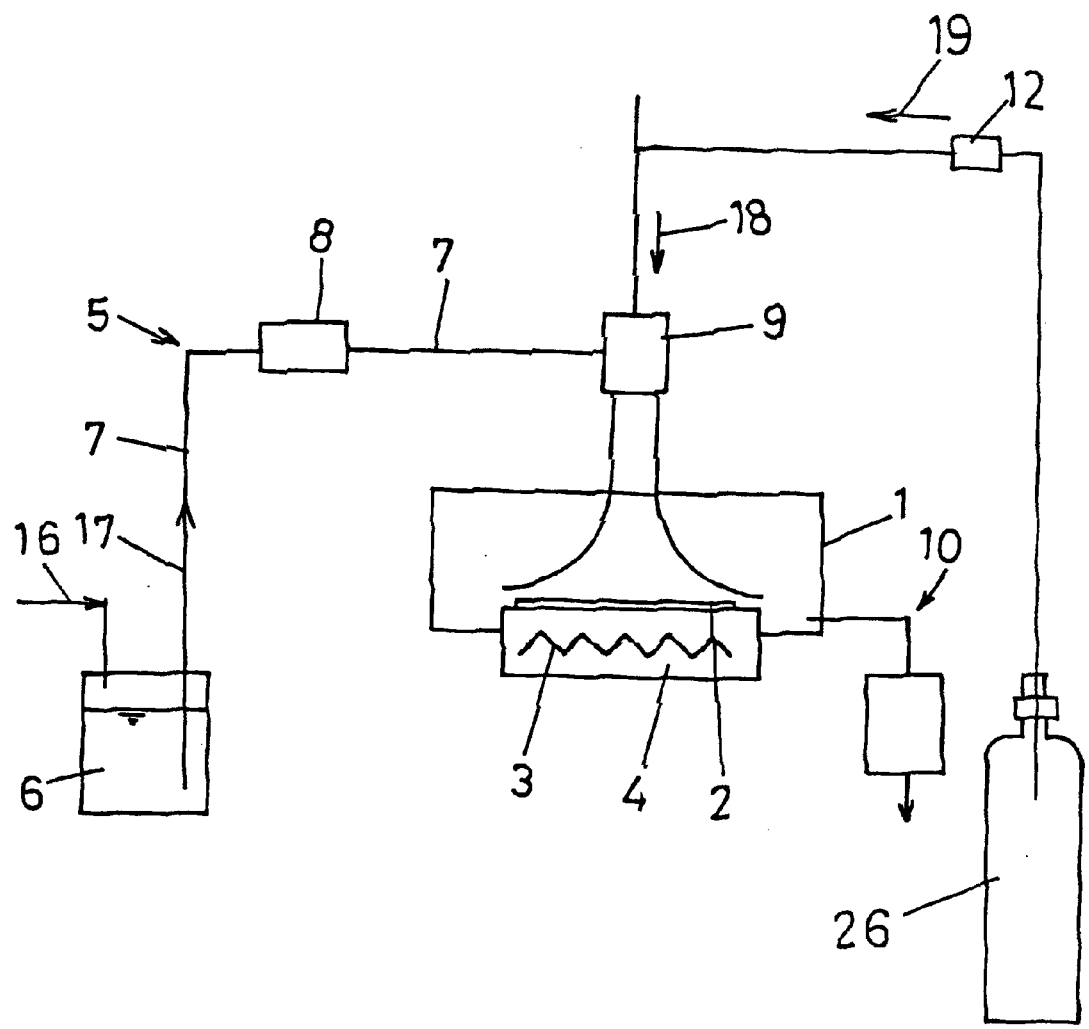
FIG. 6 is a schematic diagram of still another copper thin film forming system in accordance with the present invention.

FIG. 6 shows a schematic configuration of still another copper thin film forming system in accordance with the present invention. The gas cylinder 26 is connected to the substrate processing chamber 1 via the flow control device 12 in the system shown in FIG. 5. However, in the copper thin film forming system shown in FIG. 6, the gas cylinder 26 is connected to a pipe for introducing a carrier gas (for example, Ar gas) into the vaporizer 9 of the raw material gas introducing mechanism 5 for supplying the raw material gas to the substrate processing chamber 1 via the flow control mechanism 12.

There is no difference in operation and effect between the system shown in FIG. 6 and the system shown in FIG. 5, in which the gas cylinder 26 is connected to the substrate processing chamber 1 and the steam filled in the gas cylinder 26 is introduced directly into the substrate processing chamber 1.

Since the copper thin film forming method in accordance with the present invention using the copper thin film forming systems shown in FIG. 5 and FIG. 6 is the same as the copper thin film forming method described by using the system shown in FIG. 2 except that the steam is supplied from the gas cylinder 26, the description thereof will be omitted.

EXAMPLE 1

A copper thin film was formed under the following conditions according to the time chart shown in FIG. 3 by using the copper thin film forming system in accordance with the present invention shown in FIG. 2.

Raw material: Cu(hfac)(tmvs) containing less than about 5% by weight of tmvs

Flow of raw material: 1.1 g/min.

Flow of raw material carrier gas (Ar): 300 ml/min.

Underlying layer of substrate 2: TiN sputtered film of 100 nm in thickness

Temperature of substrate 2: 210° C.

Deposition pressure: 0.5 kPa

Flow of steam made by evaporating water from which dissolved oxygen was removed: 2 ml/min.

Time of introduction of only addition gas (steam made by evaporating water from which dissolved oxygen was removed) before start of deposition (from time $t_0$ to time $t_1$): 10 seconds Time of deposition during which raw material gas was being supplied (from time $t_1$ to time $t_3$): 60 seconds Time of introduction of addition gas (steam made by evaporating water from which dissolved oxygen is removed) at initial stage of deposition (from time $t_1$ to time $t_2$): 5 seconds Thickness of formed copper thin film: 350 nm The concentration of impurities in the copper thin film formed in the above-described way was analyzed by a secondary ion mass spectrometry (SIMS), and the concentration of impurities in the copper thin film having a thickness of 350 nm formed by using the same raw material and the conventional copper thin film forming method in which moisture was not added was analyzed. The comparison was made between the results of analysis of the concentrations of impurities, and the following results shown in Table 1 are obtained.

TABLE 1

| | CONCENTRATION OF IMPURITIES | |
|---|---|---|
| IMPURITY | CONVENTIONAL COPPER THIN FILM | COPPER THIN FILM OF PRESENT EMBODIMENT |
| C | $9 \times 10^{19}$ | $1.5 \times 10^{18}$ |
| O | $1.3 \times 10^{19}$ | $1 \times 10^{19}$ |
| F | $6 \times 10^{19}$ | $4 \times 10^{17}$ |

That is, the concentration of impurities of the formed copper thin film by using the copper thin film forming system and the copper thin film forming method in accordance with the present invention was one order or more lower than the concentration of impurities of the copper thin film formed by the conventional method. It was verified that the method and system in accordance with the present invention had the large effect of highly purifying the copper thin film.

Further, according to the method and system in accordance with the present invention, it was possible to reduce the concentration of F (fluorine) which is thought to reduce adhesion performance, particularly among impurities, by two orders or more, which results in attesting the good adhesion performance of the copper thin film formed by the method and system in accordance with the present invention.

Figure 8:
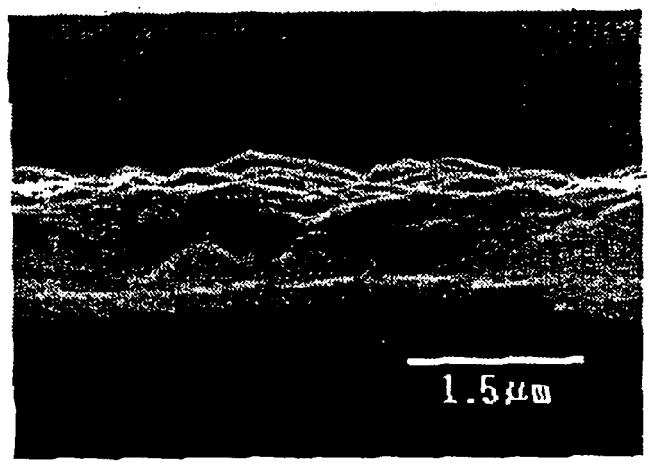
FIG. 8 is a photograph of a copper thin film formed in Example 1 when it is observed with a scanning electron microscope.

Next, the copper thin film formed by the above-described way was observed with an SEM, and no micro-void was observed as shown in FIG. 8.

Also, the specific resistance of the copper thin film was measured and was found to be the same level (1.7 $\mu\Omega\cdot$cm) as bulk Further, the copper thin film was formed under the same conditions as Example 1, except that the flow of steam made by evaporating water from which dissolved oxygen was removed was changed from 2 ml/min, which was the flow in Example 1, to 10 ml/min, The results obtained were little different from those obtained in the case where the flow of steam made by evaporating water from which dissolved oxygen was removed was 2 ml/min.

Figure 9:
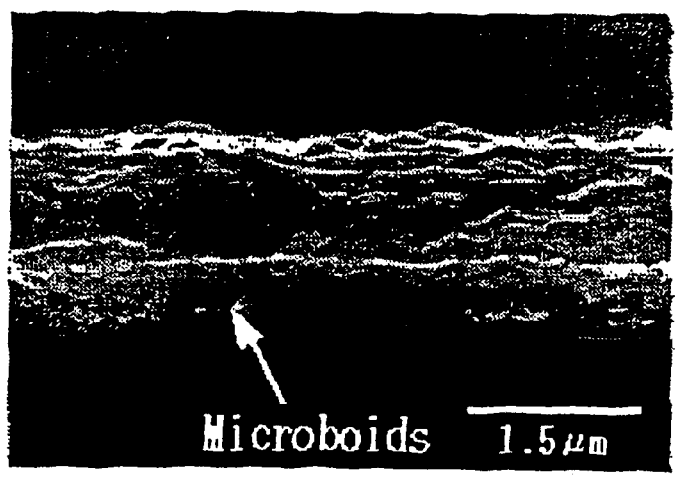
FIG. 9 is a photograph of a copper thin film formed in the case where the introduction time for an addition gas is 30 seconds or more in the copper thin film forming method in Example 1 when it is observed with a scanning electron microscope.

Still further, in order to check the extent to which the time of the introduction of the addition gas (steam made by evaporating water from which dissolved oxygen was removed) can be allowed to extend, the copper thin film was formed under the same conditions as Example 1, except that the time from the time $t_1$ to the time $t_2$, which was the initial stage of deposition, was elongated to 30 seconds or more. The copper thin film formed in this way was observed with the SEM and micro-voids were found as shown in FIG. 9. Therefore, it is thought that the maximum time of introduction of the addition gas at the initial stage of deposition preferably is about 30 seconds.

EXAMPLE 2

A copper thin film was formed under the following conditions according to the time chart shown in FIG. 4(a) by using the copper thin film forming system in accordance with the present invention shown in FIG. 2.

Raw material: Cu(hfac)(tmvs) containing less than about 5% by weight of tmvs

Flow of raw material: 1.1 g/min.

Flow of raw material carrier gas (Ar): 300 ml/min.

Underlying layer of substrate 2: TiN sputtered film of 100 nm in thickness

Temperature of substrate 2: 210° C.

Deposition pressure: 0.5 kPa

Flow of steam made by evaporating water from which dissolved oxygen is removed: 2 ml/min.

Time of introduction of addition gas (steam made by evaporating water from which dissolved oxygen is removed) before start of deposition (from time $t_0$ to time $t_1$): 10 seconds Time of deposition during which raw material gas was being flowed (from time $t_1$ to time $t_5$): 100 seconds Time of introduction of addition gas (steam made by evaporating water from which dissolved oxygen is removed) at initial stage of deposition (from time $t_1$ to time $t_2$): 5 seconds Time of following introduction of only raw material gas (from $t_2$ to $t_3$): 45 seconds Time of following introduction of addition gas (steam made by evaporating water from which dissolved oxygen was removed) in addition to the introduction of raw material gas (from time $t_3$ to time $t_4$): 5 seconds Time of following introduction of only raw material gas (from $t_{4\ to\ t5}$): 45 seconds The concentration of impurities in the copper thin film formed in the before above-described way was analyzed by the secondary ion mass spectrometry (SIMS), and the concentration of impurities in the copper thin film formed by using the same raw material and the conventional copper thin film forming method in which moisture was not added was analyzed. The comparison was made between those results of analysis of the concentrations of impurities to find that the concentrations of impurities (C, O, F) were reduced to about 1/100 (one hundredth). It was verified that the method and system in accordance with the present invention had the large effect of highly purifying the copper thin film.

Further, the copper thin film formed in this way was observed with the SEM and no micro-void was observed and. Hence, it was verified that the copper thin film forming method and system in accordance with the present invention could be applied to the process for burying a copper thin film to form a copper thin film of high purity and considerable thickness.

Still further, the copper thin film was formed under the same conditions as Example 2, except that the flow of steam made by evaporating water from which dissolved oxygen was removed was changed from 2 ml/min., which was the flow in Example 2, to 10 ml/min. The results obtained were little different from those obtained in the case where the flow of steam made by evaporating water from which dissolved oxygen was removed was 2 ml/min.

TEST EXAMPLE

The adhesion performance of the copper thin film formed by the same method as Example 1 and Example 2 was evaluated by a tape test method in which the surface of the formed copper thin film was cut in 50 checkers of 2 mm square and was stripped off with adhesive tape. The adhesion performance is expressed by the ratio of checkers remaining on the substrate, and adhesion performance 100% means that the copper than film is not stripped off.

Figure 7:
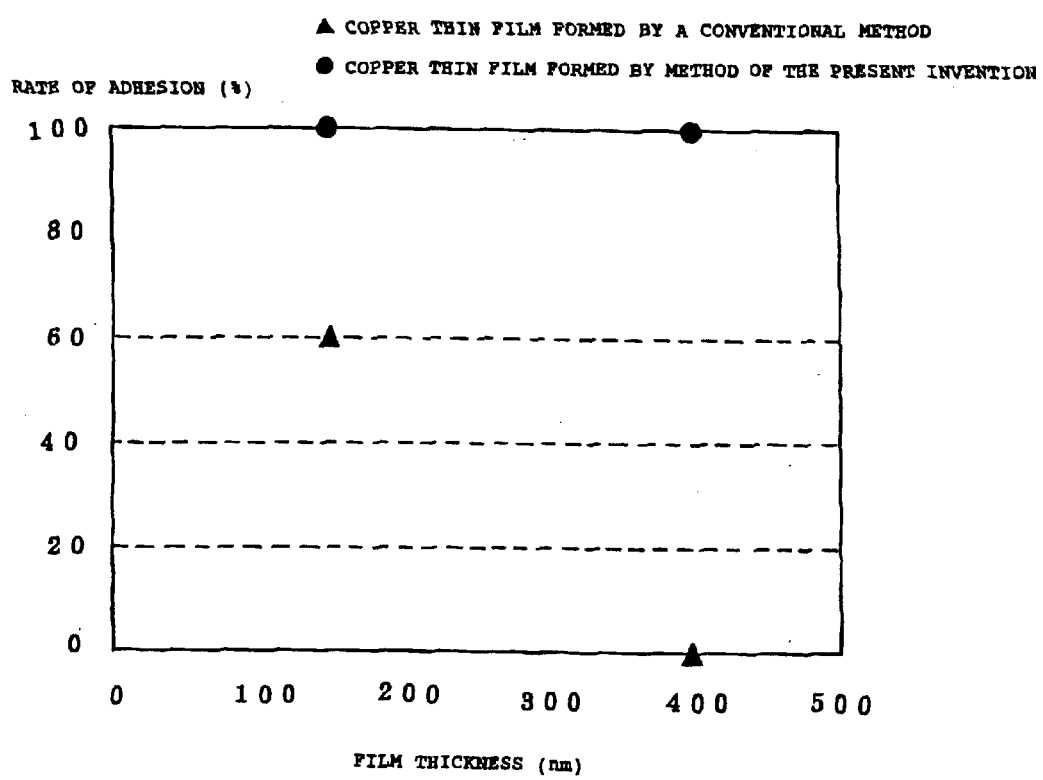
FIG. 7 is a graph showing the results of a test for evaluating adhesion performance.

The adhesion performance evaluation test was conducted also on the copper thin film formed by using the same raw material and the conventional copper thin film forming method in which moisture was not added, and the test results shown in FIG. 7 were obtained.

Usually, as a film becomes thicker, it tends to be stripped off. In the case of the copper thin film formed by the conventional copper thin film forming method in which moisture was not added, 40% of the film of 150 mm in thickness was stripped off and 100% of the film of 400 nm in thickness was stripped off In the case of the copper thin film formed by the same method as Example 1 and Example 2, however, 100% of the film was not stripped off even if the film thickness was 150 nm and 400 nm.

That is, it was verified that the method and system in accordance with the present invention could form a copper thin film having excellent adhesion performance.

While the preferred embodiments in accordance with the present invention have been described with reference to the accompanying drawings, it is not intended to limit the present invention to these preferred embodiments but the present invention may be further variously modified within the spirit and scope of the invention defined by the appended claims.

For example, as to the raw material used for the method and the system in accordance with the present invention, it is possible to use liquid raw materials or solid raw materials used by the conventional technology for forming the copper thin film by a chemical vapor deposition (CVD) method using an organometallic complex. Among such raw materials are: pure Cu(hfac)(tmvs); a mixture of pure Cu(hfac)(tmvs) and about 5% by weight of (tmvs) as a stabilizer to improve the thermal stability of the pure Cu(hfac)(tmvs); and a mixture of pure Cu(hfac)(tmvs) and about 5% by weight of (tmvs) as a stabilizer and about 0.01 to 0.4% by weight of hexafluoroacetone dihydrate (Hhfac2$H_2$O) as a reaction promoter.

Further, as to the addition gas, in place of stem made by evaporating water, it is possible to use a gas made by evaporating an alcohol derivative, a gas made by evaporating a carboxylic acid derivative, or a gas made by evaporating a β-diketone derivative.

Still further, while the steam made by evaporating water from which dissolved oxygen was removed was used as the addition gas in Example 1 and Example 2 described above, even if a gas made by evaporating water, an alcohol derivative, a carboxylic acid derivative, or a β-diketone derivative from which dissolved oxygen is not previously removed is used, it is possible to form a copper thin film of higher purity and better quality, having a lower concentration of impurities such as F, O, C in the copper thin film and a smaller number of micro-voids as compared with the copper thin film formed by the copper thin film forming method conventionally proposed in which an addition gas is continuously introduced into a substrate processing chamber during the deposition process.

Also, while dissolved oxygen in the liquid addition material was removed by bubbling it by the use of the nitrogen gas in the above-mentioned preferred embodiments, it is also possible to remove the dissolved oxygen by the other methods (for example, a method of removing dissolved oxygen by freezing the liquid addition material by the use of liquid nitrogen).

What is claimed is:

1. A method of forming a copper thin film, comprising:
supplying a raw material gas into a substrate processing chamber to form a copper thin film on a substrate stored in the substrate processing chamber;
supplying an addition gas into the substrate processing chamber in addition to the raw material gas during an initial period of said supplying of the raw material gas into the substrate processing chamber, wherein the addition gas comprises one of steam formed by evaporating water from which dissolved oxygen is removed, a gas formed by evaporating an alcohol derivative from which dissolved oxygen is removed, a gas formed by evaporating a carboxylic acid derivative from which dissolved oxygen is removed, and a gas formed by evaporating a β-diketone derivative from which dissolved oxygen is removed; and
after the initial period of said supplying of the raw material gas into the substrate processing chamber, stopping said supplying of the addition gas while continuing said supplying of the raw material gas.

2. The method of claim 1, wherein said supplying of the addition gas into the substrate processing chamber comprises supplying the addition gas into the substrate processing chamber from an addition gas-filled gas cylinder connected to the substrate processing chamber.

3. The method of claim 1, further comprising forming the raw material gas by evaporating copper hexafluoroacetylacetone(trimethylvinylsilyl)(I).

4. A method of forming a copper thin film, comprising:
supplying an addition gas into a substrate processing chamber prior to introducing a raw material gas into the substrate processing chamber, wherein the addition gas comprises one of steam formed by evaporating water from which dissolved oxygen is removed, a gas formed by evaporating an alcohol derivative from which dissolved oxygen is removed, a gas formed by evaporating a carboxylic acid derivative from which dissolved oxygen is removed, and a gas formed by evaporating a β-diketone derivative from which dissolved oxygen is removed;

after beginning said supplying of the addition gas into the substrate processing chamber, supplying the raw material gas into the substrate processing chamber to form a copper thin film on a substrate stored in the substrate processing chamber, while continuing to supply the addition gas into the substrate processing chamber;

after an initial period of said supplying of the raw material gas into the substrate processing chamber, stopping said supplying of the addition gas while continuing said supplying of the raw material gas; and resuming said supplying of the addition gas into the substrate processing chamber at predetermined intervals of time.

5. The method of claim 4, wherein said supplying of the addition gas into the substrate processing chamber comprises supplying the addition gas into the substrate processing chamber from an addition gas-filled gas cylinder connected to the substrate processing chamber.

6. The method of claim 4, further comprising forming the raw material gas by evaporating copper hexafluoroacetylacetone(trimethylvinylsilyl)(I).

7. A method of forming a copper thin film, comprising:

supplying a raw material gas into a substrate processing chamber to form a copper thin film on a substrate stored in the substrate processing chamber;

supplying an addition gas into the substrate processing chamber in addition to the raw material gas during an initial period of said supplying of the raw material gas into the substrate processing chamber; and after the initial period of said supplying of the raw material gas into the substrate processing chamber, stopping said supplying of the addition gas while continuing said supplying of the raw material gas; and resuming said supplying of the addition gas into the substrate processing chamber at predetermined intervals of time.

8. The method of claim 7, wherein the addition gas comprises one of steam formed by evaporating water, a gas formed by evaporating an alcohol derivative, a gas formed by evaporating a carboxylic acid derivative, and a gas formed by evaporating a β-diketone derivative.

9. The method of claim 8, wherein said supplying of the addition gas into the substrate processing chamber comprises supplying the addition gas into the substrate processing chamber from an addition gas-filled gas cylinder connected to the substrate processing chamber.

10. The method of claim 7, wherein the addition gas comprises one of steam formed by evaporating water from which dissolved oxygen is removed, a gas formed by evaporating an alcohol derivative from which dissolved oxygen is removed, a gas formed by evaporating a carboxylic acid derivative from which dissolved oxygen is removed, and a gas formed by evaporating a β-diketone derivative from which dissolved oxygen is removed.

11. The method of claim 10, wherein said supplying of the addition gas into the substrate processing chamber comprises supplying the addition gas into the substrate processing chamber from an addition gas-filled gas cylinder connected to the substrate processing chamber.

12. The method of claim 7, further comprising forming the raw material gas by evaporating copper hexafluoroacetylacetone(trimethylvinylsilyl)(I).

13. A method of forming a copper thin film, comprising:

supplying an addition gas into a substrate processing chamber prior to introducing a raw material gas into the substrate processing chamber;

after beginning said supplying of the addition gas into the substrate processing chamber, supplying the raw material gas into the substrate processing chamber to form a copper thin film on a substrate stored in the substrate processing chamber, while continuing to supply the addition gas into the substrate processing chamber;

after an initial period of said supplying of the raw material gas into the substrate processing chamber, stopping said supplying of the addition gas while continuing said supplying of the raw material gas; and resuming said supplying of the addition gas into the substrate processing chamber at predetermined intervals of time.

14. The method of claim 13, wherein the addition gas comprises one of steam formed by evaporating water, a gas formed by evaporating an alcohol derivative, a gas formed by evaporating a carboxylic acid derivative, and a gas formed by evaporating a β-diketone derivative.

15. The method of claim 14, wherein said supplying of the addition gas into the substrate processing chamber comprises supplying the addition gas into the substrate processing chamber from an addition gas-filled gas cylinder connected to the substrate processing chamber.

16. The method of claim 13, further comprising forming the raw material gas by evaporating copper hexafluoroacetylacetone(trimethylvinylsilyl)(I).

17. A method of forming a copper thin film, comprising:

supplying an addition gas into a substrate processing chamber prior to introducing a raw material gas into the substrate processing chamber, wherein the addition gas comprises one of steam formed by evaporating water from which dissolved oxygen is removed, a gas formed by evaporating carboxylic acid derivative from which dissolved oxygen is removed, and a gas formed by evaporating a β-diketone derivative from which dissolved oxygen is removed;

after beginning said supplying of the addition gas into the substrate processing chamber, supplying the raw material gas into the substrate processing chamber to form a copper thin film on a substrate stored in the substrate processing chamber, while continuing to supply the addition gas into the substrate processing chamber; and after an initial period of said supplying of the raw material gas into the substrate processing chamber, stopping said supplying of the addition gas while continuing said supplying of the raw material gas.

18. The method of claim 17, wherein said supplying of the addition gas into the substrate processing chamber comprises supplying the addition gas into the substrate processing chamber from an addition gas-filled gas cylinder connected to the substrate processing chamber.

19. The method of claim 17, further comprising forming the raw material gas by evaporating copper hexafluoroacetylacetone(trimethylvinylsilyl)(I).

* * * * *